United States Patent
Liu et al.

(10) Patent No.: US 12,206,155 B2
(45) Date of Patent: Jan. 21, 2025

(54) RADIO FREQUENCY OSCILLATOR WITH CERAMIC RESONATOR AND SURFACE-MOUNTED INTEGRATED CIRCUIT PACKAGE

(71) Applicant: QUALCOMM Incorporated, San Diego, CA (US)

(72) Inventors: Kai Liu, Phoenix, AZ (US); Jonghae Kim, San Diego, CA (US); Jui-Yi Chiu, Taichung (TW); Nosun Park, San Diego, CA (US); Je-Hsiung Lan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 25 days.

(21) Appl. No.: 18/189,684

(22) Filed: Mar. 24, 2023

(65) Prior Publication Data

US 2024/0322417 A1 Sep. 26, 2024

(51) Int. Cl.
*H01P 7/10* (2006.01)
*H01P 7/06* (2006.01)
(Continued)

(52) U.S. Cl.
CPC ............... *H01P 7/10* (2013.01); *H01P 7/065* (2013.01); *H01P 11/008* (2013.01); *H03B 5/1206* (2013.01)

(58) Field of Classification Search
CPC .......... H01P 7/10; H01P 11/008; H01P 7/065; H03B 5/1206; H03B 5/1817
(Continued)

(56) References Cited

U.S. PATENT DOCUMENTS

| 7,057,480 B2 * | 6/2006 | Pance | H01P 7/10 333/219.1 |
| 2012/0075026 A1 * | 3/2012 | Ruby | H03L 1/04 331/70 |
| 2023/0009025 A1 | 1/2023 | Hörberg et al. | |

FOREIGN PATENT DOCUMENTS

ES 2286346 T3 12/2007

OTHER PUBLICATIONS

International Search Report and Written Opinion—PCT/US2024/019429—ISA/EPO—Jun. 17, 2024.
(Continued)

*Primary Examiner* — Arnold M Kinkead
(74) *Attorney, Agent, or Firm* — Muncy, Geissler, Olds & Lowe, P.C.

(57) ABSTRACT

In an aspect, an apparatus is disclosed that includes a surface-mounted integrated circuit package housing an active oscillator circuit; an integrated ceramic resonator formed from a ceramic substrate having an upper planar surface receiving the surface-mounted integrated circuit package, the integrated ceramic resonator including a plurality of conductive walls forming a conductive periphery of a ceramic cavity in the ceramic substrate, a conductive rod extending vertically into the ceramic cavity, wherein the conductive rod is isolated from contact with the conductive periphery of the ceramic cavity, a first conductive material extending vertically through the upper planar surface of the ceramic substrate for connecting the conductive periphery of the ceramic cavity to the surface-mounted integrated circuit package housing the active oscillator circuit; and a second conductive material extending through the upper planar surface of the ceramic substrate for connecting the conductive rod to the surface-mounted integrated circuit package.

30 Claims, 11 Drawing Sheets

(51) Int. Cl.
*H01P 11/00* (2006.01)
*H03B 5/12* (2006.01)

(58) Field of Classification Search
USPC ........ 331/154, 116 R; 310/344; 438/51, 613, 438/620, 622; 333/219.1, 222, 202
See application file for complete search history.

(56) References Cited

OTHER PUBLICATIONS

Jung D.Y., et al., "High-Q Circular LTCC Resonator Using Zigzagged Via Posts and a Short Stub for Millimeter-Wave System-on-Package Applications", IEEE Transactions on Advanced Packaging, IEEE Service Center, Piscataway, NJ, USA, vol. 32, No. 1, Feb. 1, 2009, pp. 216-222, XP011249811, chapters I-III, figures 1-7.

\* cited by examiner

RADIO FREQUENCY OSCILLATOR WITH CERAMIC RESONATOR AND SURFACE-MOUNTED INTEGRATED CIRCUIT PACKAGE

FIELD OF DISCLOSURE

The present disclosure relates generally to semiconductor devices including electronic devices incorporating the semiconductor devices, and more specifically, but not exclusively, integrated ceramic resonators and fabrication techniques for forming the integrated ceramic resonators.

BACKGROUND

Integrated circuit technology has achieved great strides in advancing computing power through miniaturization of active components. Various packaging technologies can be found in many electronic devices, including processors, servers, radio frequency (RF) integrated circuits, etc. Advanced packaging and processing techniques allow for the manufacture of complex devices, such as multi-die devices and system on a chip (SOC) devices, which may include multiple function blocks, with each function block designed to perform a specific function, such as, for example, a microprocessor function, a graphics processing unit (GPU) function, a communications function (e.g., Wi-Fi, Bluetooth, and other communications), a clock generation function, a radio frequency (RF) generation function, and the like.

Integrated circuit devices may include oscillators to generate fixed frequency signals. Such oscillators may use external passive resonators, such as quartz crystals, and may be constructed to generate stable, low-frequency signals (e.g., clocks and/or other fixed frequency signals in the kilohertz through megahertz region of the electromagnetic spectrum). Such oscillators may include active integrated oscillator circuits (e.g., complementary metal oxide semiconductor (CMOS) devices) that are coupled to the quartz crystals, where the quartz crystals are constructed to resonate at a fixed frequency.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus includes a surface mounted integrated circuit package housing an active oscillator circuit; an integrated ceramic resonator formed from a ceramic substrate having an upper planar surface receiving the surface mounted integrated circuit package, the integrated ceramic resonator including a plurality of conductive walls forming a conductive periphery of a ceramic cavity in the ceramic substrate, a conductive rod extending vertically at least partially into the ceramic cavity, wherein the conductive rod is isolated from contact with the conductive periphery of the ceramic cavity, a first conductive material extending vertically through the upper planar surface of the ceramic substrate for connecting the conductive periphery of the ceramic cavity to the surface mounted integrated circuit package housing the active oscillator circuit; and a second conductive material extending through the upper planar surface of the ceramic substrate for connecting the conductive rod to the surface mounted integrated circuit package housing the active oscillator circuit.

In an aspect, an integrated ceramic resonator includes a ceramic substrate having an upper planar surface for receiving a surface mounted electronic device; a plurality of conductive walls forming a conductive periphery of a ceramic cavity in the ceramic substrate; a conductive rod extending vertically at least partially into the ceramic cavity, wherein the conductive rod is isolated from contact with the conductive periphery of the ceramic cavity; a first via structure disposed vertically through the upper planar surface of the ceramic substrate for connecting the conductive periphery of the ceramic cavity to the surface mounted electronic device; and a second via structure disposed through the upper planar surface of the ceramic substrate for connecting the conductive rod to the surface mounted electronic device.

In an aspect, a method for manufacturing an integrated device includes forming a plurality of planar ceramic layers, wherein one or more of the plurality of planar ceramic layers include corresponding patterned metal layers; aligning the plurality of planar ceramic layers and corresponding patterned metal layers to overlie one another; and fusing the plurality of planar ceramic layers and the corresponding patterned metal layers with one another in a thermal process to form an integrated ceramic resonator having an upper planar surface for receiving a surface mounted integrated circuit package, a plurality of conductive walls defining a conductive periphery of a ceramic cavity, a conductive rod extending vertically at least partially into the ceramic cavity, wherein the conductive rod is isolated from contact with the conductive periphery of the ceramic cavity, a first via structure extending vertically through the upper planar surface for connecting the conductive periphery of the ceramic cavity to the surface mounted integrated circuit package, and a second via structure extending vertically through the upper planar surface for connecting the conductive rod to the surface mounted integrated circuit package.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
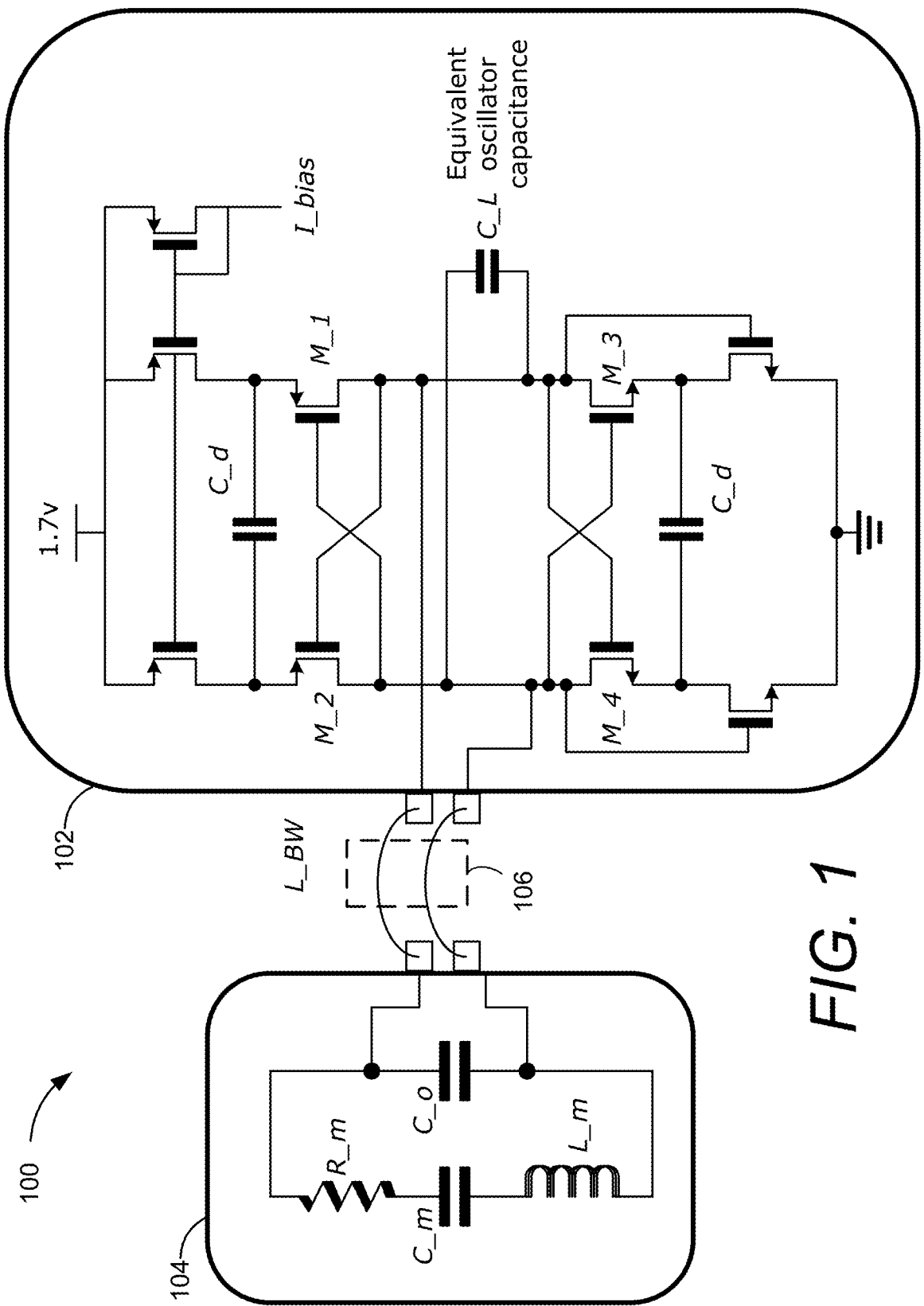
FIG. 1 is a schematic diagram of equivalent circuits used to implement a radio frequency (RF) oscillator, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises." "comprising," "includes," and/or "including." when used herein, specify the presence of stated features, integers, steps, operations, elements, and/or components, but do not preclude the presence or addition of one or more other features, integers, steps, operations, elements, components, and/or groups thereof. It will also be understood that when a layer is described as "over," "overlying." "under," "underlying." another layer does not necessarily preclude the use of intermediate layers and/or materials that may otherwise be used to ensure adhesion between the layers. Likewise, it will be understood that the terms "vertical," "horizontal," "upper," "lower," and "side" are merely used to describe the relative position and/or orientation between certain components and/or structures as shown in the coordinate system used in the figures. It will be recognized that such relative position and/or orientation relationships may be translated to other coordinates systems based on the orientation of a device that includes such components and/or structures.

In order to fully illustrate aspects of the design of the present disclosure, methods of fabrication are presented. Other methods of fabrication are possible, and discussed fabrication methods are presented only to aid understanding of the concepts disclosed herein.

Certain aspects of the disclosure are directed to a ceramic resonator formed as an integrated structure that may be used in conjunction with active oscillator circuits (e.g., complementary metal oxide semiconductor (CMOS) integrated circuits enclosed in a surface mounted integrated circuit package) for radio frequency (RF) signal generation (e.g., RF signals in the gigahertz range of the electromagnetic spectrum). The ceramic resonators disclosed herein stand in contrast to the quartz crystals typically used to generate such RF signals. In contrast to oscillators using the quartz crystals, certain aspects of the disclosed ceramic resonators allow surface mounting of an integrated circuit package (e.g., a surface-mounted integrated circuit package including an active oscillator circuit) to a surface of the ceramic resonator. In an aspect, surface mounting of the integrated circuit package to the disclosed ceramic resonators reduces the spurious capacitances and/or inductances that are typically present when a resonator is coupled to an oscillator circuit using conventional wire bonding processes. Such spurious capacitances and/or inductances may result in RF instabilities. In accordance with certain aspects of the disclosure, such RF instabilities are substantially reduced and/or eliminated through surface mounting of the integrated circuit package directly to the ceramic resonator.

Certain aspects of the disclosure are directed to an integrated ceramic resonator having a ceramic cavity that is defined by a plurality of conductive walls and a conductive rod that extends at least partially into the ceramic cavity. The conductive walls and the conductive rod are arranged in the integrated ceramic resonator to facilitate the connection of the conductive walls and the conductive rod to a planar surface of the integrated ceramic resonator that is configured to receive the surface mounted integrated circuit package containing the active oscillator circuit.

FIG. 1 is a schematic diagram of equivalent circuits used to implement an RF oscillator 100, according to aspects of the disclosure. In this example, the RF oscillator 100 includes an active oscillator circuit 102 that is coupled to a passive resonator 104. In FIG. 1, reference identifiers that include an "_" are to be interpreted as indicating that any reference character following the "_" corresponds to a subscript. For example, reference identifier "C_m" in the figures corresponds to "$C_m$" elsewhere in this disclosure.

The passive resonator 104 may be in the form of a quartz crystal when the RF oscillator 100 is used to generate low-frequency signals. However, certain aspects of the disclosure are implemented with a recognition that using a quartz crystal as the passive resonator 104 increases the size of the RF oscillator 100 and limits the ability to construct the RF oscillator 100 as an integrated unit. Further, certain aspects of the disclosure are implemented with a recognition that an RF oscillator using quartz crystals may be sensitive to mechanical shock and/or slow to start oscillation. Still further, the security of an electronic system incorporating the quartz crystal may be compromised due to the exposure of the clock pins of the quartz crystal when the quartz crystal is wire bonded to the active oscillator circuit 102.

For scenarios in which the RF oscillator 100 operates in higher frequency ranges (e.g., frequencies above 1 gigahertz (GHz)), a quartz crystal is unsuitable for use as the passive resonator 104. In such scenarios, the passive resonator 104 may be in the form of a bulk-acoustic-wave (BAW) resonator. Such a BAW resonator may be either a Film-BAW (FBAW) or a Solid Mounted Reflector-BAW (SMR-BAW). Some BAWs may include dual reflectors (e.g., a double-sided SMR-BAW). However, certain aspects of the disclosure are implemented with the recognition that BAW resonators may be difficult to manufacture. Additionally, certain aspects of the disclosure are implemented with the recognition that such BAW resonators must be coupled to the active oscillator circuit 102 using a wire-bonding process. Using wires to couple the BAW resonator to the active oscillator circuit produces difficulties in consistently manufacturing the RF oscillator 100 so that it is tuned to the desired resonant frequency. Additionally, such wired coupling may degrade the frequency stability of the RF oscillator 100.

In accordance with certain aspects of the disclosure, the RF oscillator 100 may operate in four possible modes when the passive resonator 104 is implemented as a BAW resonator. First, the RF oscillator 100 may operate in a latched mode if the values of Ca are too small. Second, the RF oscillator 100 may operate in a parasitic relaxation oscillation mode if the values of Ca are greater than n*$C_f$/2. Third, the RF oscillator 100 may operate at the desired oscillation frequency (e.g., in the GHz range of the electromagnetic spectrum, such as at 2.5 GHZ).

In a fourth mode of operation, the RF oscillator 100 may operate with a parasitic oscillation having a frequency of $f_B$. In an aspect, the frequency $f_B$ may range between 5 GHz and 8 GHz when the RF oscillator 100 is configured to operate at a resonant frequency of 2.5 GHZ. Using the model of the RF oscillator 100 shown in FIG. 1, the frequency $f_B$ may be expressed as follows:

$$f_b = 1 / \left( 2\pi * \sqrt{L_{BW} * \left( \frac{C_L * C_0}{C_L + C_0} \right)} \right)$$

Based on this equation, the bond wires 106 coupling the active oscillator circuit 102 with the passive resonator 104 should be spaced as closely as packaging rules allow to reduce mutual coupling and ensure that the RF oscillator 100 does not have a gain at frequency $f_B$. Further, CMOS transistors $M_1$-$M_4$ may be dimensioned and biased to ensure that there is no loop gain at any parasitic oscillation frequencies.

As will be understood from the teachings of the present disclosure, bond wires 106 need not be used to couple the active oscillator circuit 102 with the passive resonator 104 when the passive resonator 104 is constructed according to aspects of the disclosure. To this end, certain aspects of the disclosure allow surface mounting of an integrated circuit package (e.g., a package including the active oscillator circuit 102) to a surface of an integrated ceramic resonator that is used as the passive resonator 104.

Figure 2A:
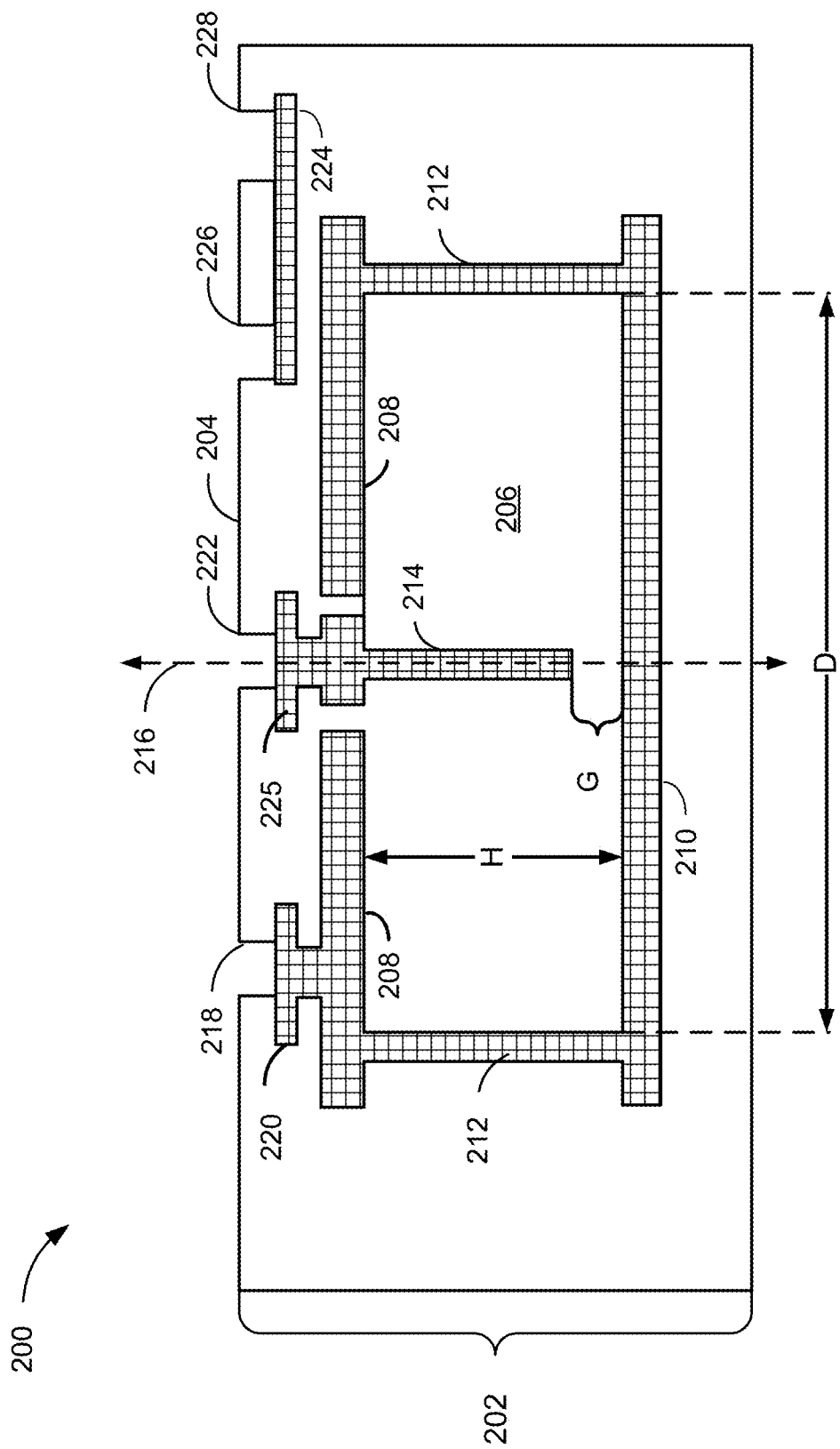
FIG. 2A is a cross-sectional view of an example integrated ceramic resonator, according to aspects of the disclosure.

FIG. 2A is a cross-sectional view of an example integrated ceramic resonator 200, according to aspects of the disclosure. As shown in FIG. 2A, the integrated ceramic resonator 200 includes a ceramic substrate 202 having an upper surface 204 that is configured to receive a surface-mounted integrated circuit package. In this example, the integrated ceramic resonator 200 includes a plurality of conductive walls forming a conductive periphery of a ceramic cavity 206. In an aspect, the plurality of conductive walls may be formed from a metal such as copper, silver, aluminum, etc.

The conductive walls forming the conductive periphery of the ceramic cavity 206 shown in FIG. 2A include an upper conductive wall 208 and a lower conductive wall 210 that are vertically spaced from one another. In this example, the upper conductive wall 208 and the lower conductive wall 210 are formed as planar structures that are generally parallel with one another. The upper conductive wall 208 and the lower conductive wall 210 define a height H of the ceramic cavity 206 in this example.

The conductive walls forming the conductive periphery of the ceramic cavity 206 also include a vertical conductive wall 212. In this example, the vertical conductive wall 212 provides a conductive path that connects the upper conductive wall 208 with the lower conductive wall 210. In an aspect, the vertical conductive wall 212 circumvents the entire vertical periphery of the ceramic cavity 206 and defines its diameter D.

The integrated ceramic resonator 200 may also include a conductive rod 214 that extends vertically at least partially into the ceramic cavity 206. The conductive rod 214 is electrically isolated from the plurality of conductive walls disposed about the ceramic cavity 206 and does not span the total height H of the ceramic cavity 206. In an aspect, the conductive rod 214 terminates short of the lower conductive wall 210 so that a gap G is formed between the terminus of the conductive rod 214 and the lower conductive wall 210. In an aspect, the conductive rod 214 extends along a central vertical axis 216 of the ceramic cavity 206.

The integrated ceramic resonator 200 also includes structures disposed through the upper surface 204 that are used to facilitate formation of conductive paths between the integrated ceramic resonator 200 and the terminals of a surface-mounted integrated circuit package (not shown in FIG. 2) housing an integrated circuit (e.g., active oscillator circuit such as active oscillator circuit 102 shown in FIG. 1). In the example shown in FIG. 2A, a via structure 218 overlies a terminal 220 that is connected to the conductive periphery of the ceramic cavity 206 (e.g., the upper conductive wall 208 in FIG. 2A). Another via structure 222 overlies a terminal 225 that is connected to the conductive rod 214. In an aspect, a first terminal of the active oscillator circuit housed in the surface-mounted package is connected to the terminal 220 through via structure 218 (e.g., through a solder connection formed in the via structure 218 during mounting of the surface-mounted integrated circuit package to the integrated ceramic resonator 200) while a second terminal of the active oscillator circuit housed in the surface mounted package is connected to the terminal 225 through via structure 222 (e.g., through a solder connection formed in the via structure 222 during mounting of the surface mounted integrated circuit package to the integrated ceramic resonator 200).

In an aspect, the integrated ceramic resonator 200 may include power strips 224 (only one power strip 224 shown in FIG. 2A) that provide conductive paths between a power supply (not shown) and the power terminals of a surface-mounted integrated circuit package mounted to the upper surface 204 of the integrated ceramic resonator 200. In this example, via structures 226 and 228 overly the power strip 224. The via structure 226 may facilitate the formation of a conductive path (e.g., by being filled with solder during a surface mounting process) between the power strip 224 and a power terminal of the surface mounted integrated circuit package (not shown in FIG. 2A). The via structure 228 may facilitate the formation of a conductive path (e.g., by being filled with solder during mounting of a power supply at the upper surface 204 of the integrated ceramic resonator 200 or connection of an off-board power supply with the integrated ceramic resonator 200) between the power strip 224 and a terminal of the power supply.

Figure 2B:
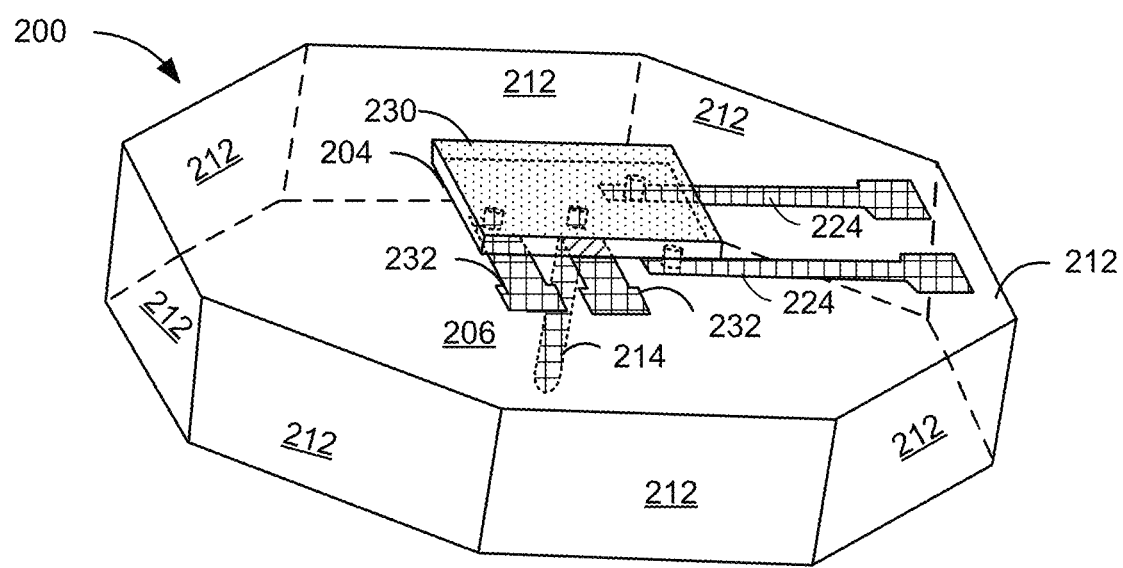
FIG. 2B is a partial perspective view of the integrated ceramic resonator, according to aspects of the disclosure.

FIG. 2B is a partial perspective view of the integrated ceramic resonator 200, according to aspects of the disclosure. In FIG. 2B, a surface-mounted integrated circuit package 230 housing an active oscillator circuit is mounted at the upper surface 204 of the integrated ceramic resonator 200. The power strips 224 provide power to the active oscillator circuit in the surface-mounted integrated circuit package 230. A further pair of conductive strips 232 provide a path for the RF signal output of the RF oscillator. In an aspect, the power strips 224 and conductive strips 232 may be orthogonally oriented with respect to one another to limit coupling between the power supply path and the RF signal output.

In FIG. 2B, only the vertical conductive wall 212 of the plurality of conductive walls that form the periphery of the ceramic cavity 206 are depicted. In an aspect, the vertical conductive wall 212 may be formed as a generally cylindrical structure (e.g., a cylindrical structure or multi-sided structure having a number of sides that render the vertical conductive wall 212 sufficiently cylindrical to operate within design constraints). In FIG. 2B, the vertical conductive wall 212 is formed as an octagonal structure. In an aspect, the vertical conductive wall 212 may be formed as a higher degree multi-sided structure (e.g., a multi-sided structure having more than eight sides). However, in certain scenarios, the vertical conductive wall 212 may also be formed as a lower-degree multi-sided structure.

In accordance with certain aspects of the disclosure, the integrated ceramic resonator 200 may be designed to have a resonant frequency in a frequency range proximate 2.5 GHZ. To this end, the ceramic cavity 206 may have a diameter D of approximately 10 millimeters (mm) and a ceramic cavity height H of approximately 1.5 mm to 2 mm. The conductive rod 214 may have a diameter between about 125 micrometers (μm) and 300 μm, and the thickness of the vertical conductive wall 212 may be in a range between about 50 μm and 100 μm. The resulting integrated ceramic resonator may have a high-quality factor (Q) that is similar to or better than the Q of a BAW resonator. For higher resonant frequency ranges (e.g., frequency ranges proximate 10 GHz), the foregoing dimensions may be reduced and may be increased for lower resonant frequency ranges (e.g., frequency ranges proximate 1 GHZ).

Figure 3A:
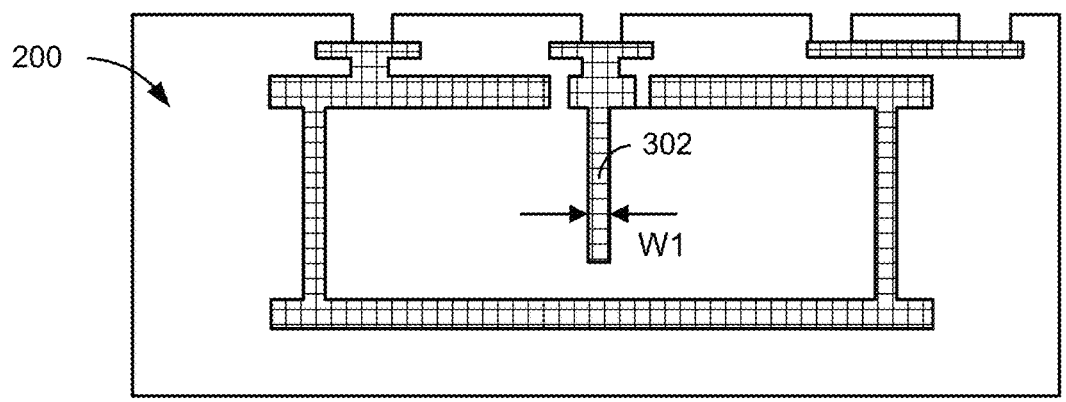
FIG. 3A through FIG. 3C illustrate the effect that the diameter of the conductive rod has on the frequency response of the integrated ceramic resonator, according to aspects of the disclosure.
Figure 3B:
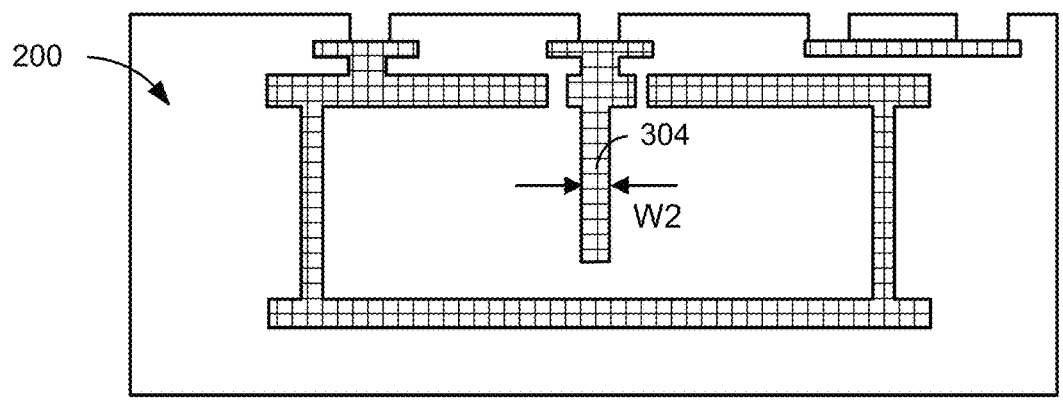
Figure 3C:
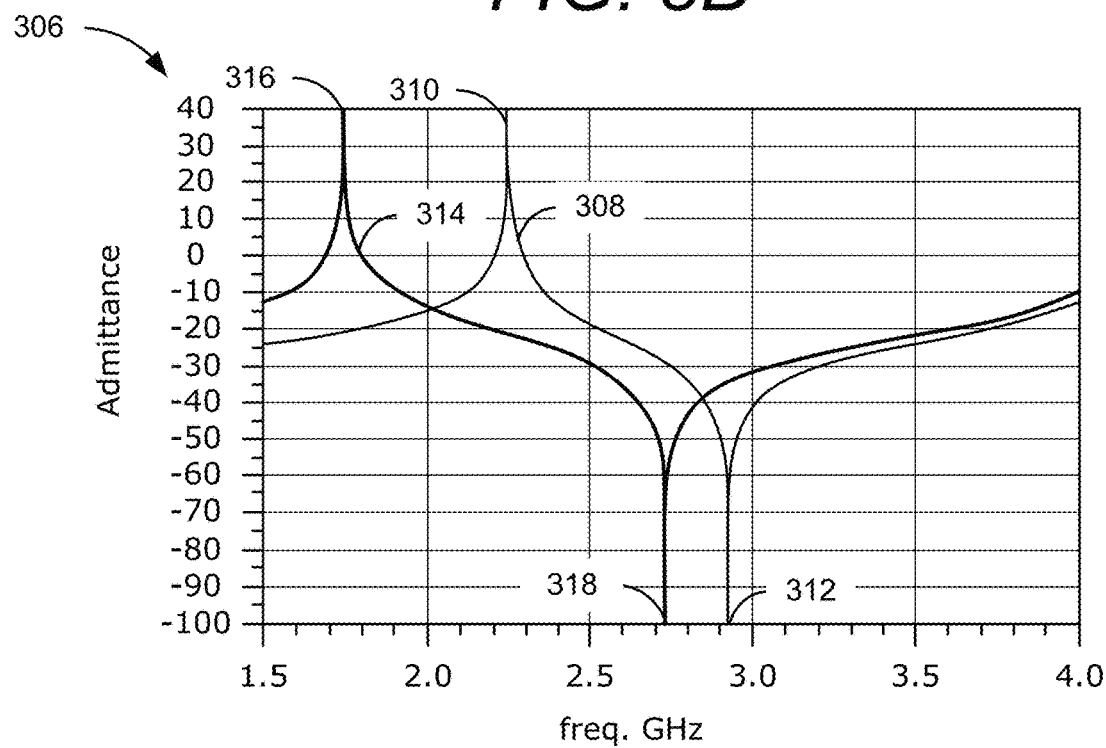

FIGS. 3A through 3C (collectively FIG. 3) illustrate the effect that the diameter of the conductive rod has on the frequency response of the integrated ceramic resonator, according to aspects of the disclosure. In this example, the conductive rod 302 shown in FIG. 3A has a first diameter W1 (e.g., approximately 175 μm), while the conductive rod 304 shown in FIG. 3B has a second diameter W2 (e.g., approximately 275 μm) that is greater than the first diameter W1. The effect of the different diameters of the conductive rod on the resonant frequency of the integrated ceramic resonator is shown in the graph 306 of FIG. 3C. Here, the graph 306 shows the admittance of the integrated ceramic resonator as a function of frequency. In this example, line 308 corresponds to the frequency response of an integrated ceramic resonator having a conductive rod of diameter W1, where the peaks 310 and 312 occur at the resonant frequencies of the integrated ceramic resonator. Similarly, line 314 corresponds to the frequency response of an integrated ceramic resonator having a conductive rod of diameter W2, where the peaks 316 and 318 occur at the resonant frequencies of the integrated ceramic resonator. As evident from the frequency responses shown in graph 306, the frequency response of an integrated ceramic resonator may be shifted to a higher frequency range by reducing the diameter of the conductive rod. Likewise, the frequency response of the integrated ceramic resonator may be shifted to a lower frequency range by increasing the diameter of the conductive rod.

Figure 4A:
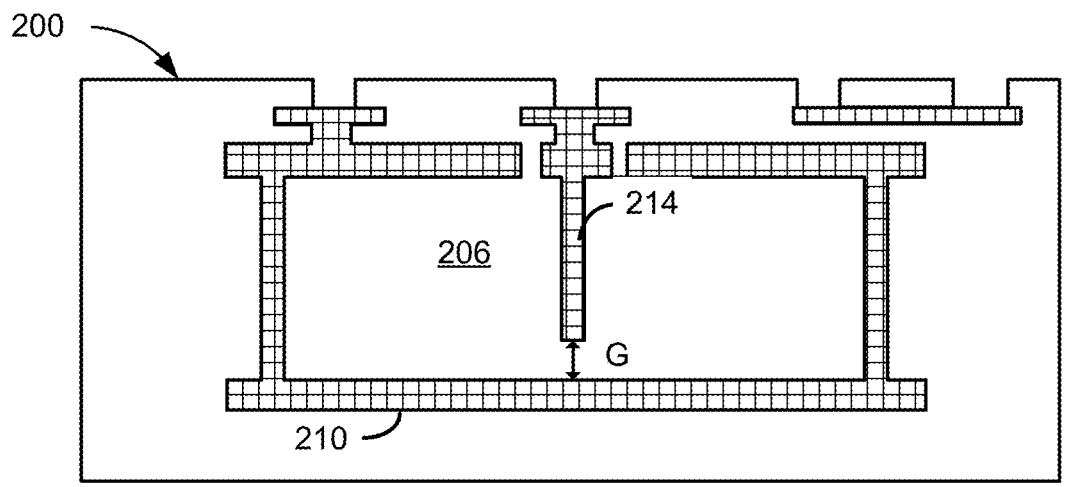
FIG. 4A and FIG. 4B illustrate the effect that the dimension of the gap between the terminus of the conductive rod and the lower conductive wall of the ceramic cavity has on the frequency response of the integrated ceramic resonator, according to aspects of the disclosure.
Figure 4B:
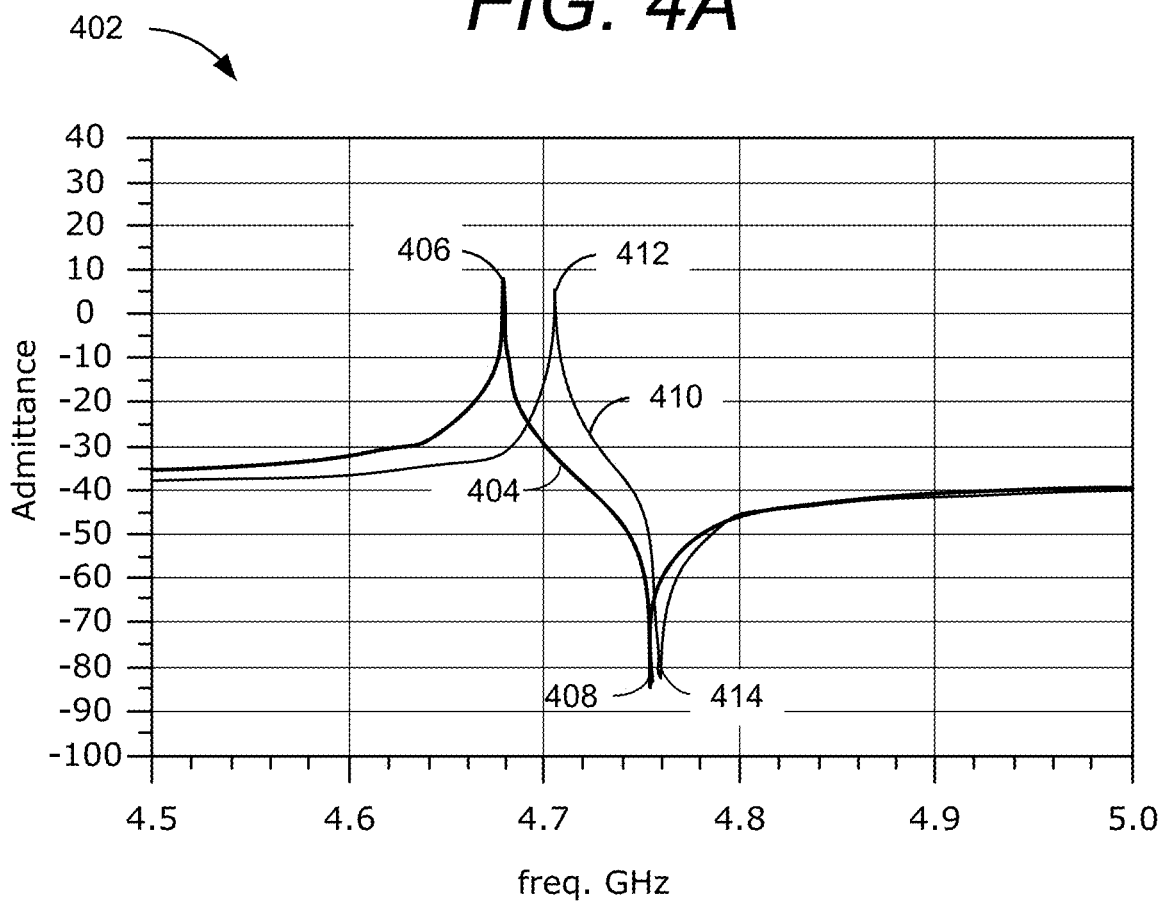

FIGS. 4A and 4B (collectively FIG. 4) illustrate the effect that the dimension of the gap between the terminus of the conductive rod and the lower conductive wall of the ceramic cavity has on the frequency response of the integrated ceramic resonator, according to aspects of the disclosure. As shown in FIG. 4A, the conductive rod 214 extends vertically into the ceramic cavity 206 and terminates to form a gap having a dimension G from the bottom conductive wall 210. The effect of different dimensions of G on the frequency response of the integrated ceramic resonator is shown in the graph 402 of FIG. 4B. Here, graph 402 shows the admittance of the integrated ceramic resonator as a function of frequency. In this example, line 404 corresponds to the frequency response of an integrated ceramic resonator having a gap G of approximately 15 μm, where the peaks 406 and 408 occur at the resonant frequencies of the integrated ceramic resonator. Similarly, line 410 corresponds to the frequency response of an integrated ceramic resonator having a gap G of approximately 50 μm, where the peaks 412 and 414 occur at the resonant frequencies of the integrated ceramic resonator. As evident from the frequency responses shown in graph 402, the frequency response of an integrated ceramic resonator may be shifted to a higher frequency range by reducing the dimension G of the gap. Likewise, the frequency response of the integrated ceramic resonator may be shifted to a higher frequency range by increasing the dimension G of the gap. In certain scenarios, however, increasing the dimension G of the gap may result in lower Q factors when compared to Q factors obtained in integrated ceramic resonators having lower dimensions G for the gap.

In accordance with certain aspects of the disclosure, the integrated ceramic resonator may be manufactured using low-temperature cofired ceramic (LTCC) processes. In an aspect, a plurality of planar ceramic layers having corresponding metallization may be formed in separate operations. The planar ceramic layers formed in the separate operations may be subsequently aligned with one another and heated (e.g., sintered) to fuse the ceramic layers and the corresponding metallization into a single integrated structure having the features of the integrated ceramic resonator 200.

FIGS. 5A through 5H (collectively FIG. 5) illustrate various steps in the manufacture of an RF oscillator having an integrated ceramic resonator and a surface-mounted integrated circuit package, according to aspects of the disclosure. In an aspect, the ceramic layers shown in the operations shown in FIG. 5 may be cut from ceramic tape. In an aspect, the via structures shown in FIG. 5 may be formed in the ceramic layers using, for example, drilling techniques. In an aspect, the metal structures shown in FIG. 5 may be deposited on the surfaces of the ceramic layers and in the via structures using metal printing techniques. Based on the teachings of the present disclosure, it will be understood that other processes may be employed to implement the manufacturing steps shown in FIG. 5.

Figure 5A:
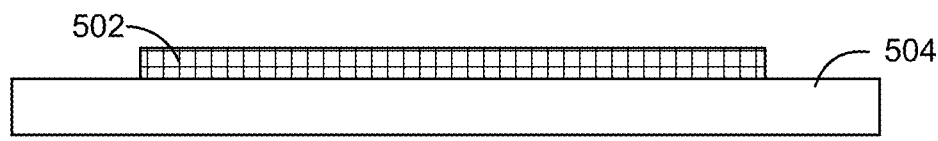
FIG. 5A through FIG. 5H illustrate various steps in the manufacture of an RF oscillator having an integrated ceramic resonator and a surface-mounted integrated circuit package, according to aspects of the disclosure.

The various steps shown in FIGS. 5A through 5F are directed to the formation of the ceramic layers and corresponding metallization layers prior to fusion. In FIG. 5A, a metal layer 502 is deposited on an upper surface of a first ceramic layer 504. The metal layer 502 ultimately forms the lower conductive wall 210 of the ceramic cavity 206 (see FIG. 2A).

Figure 5B:
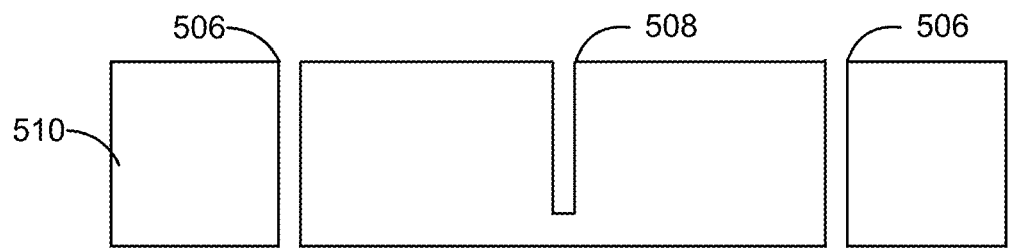
Figure 5C:
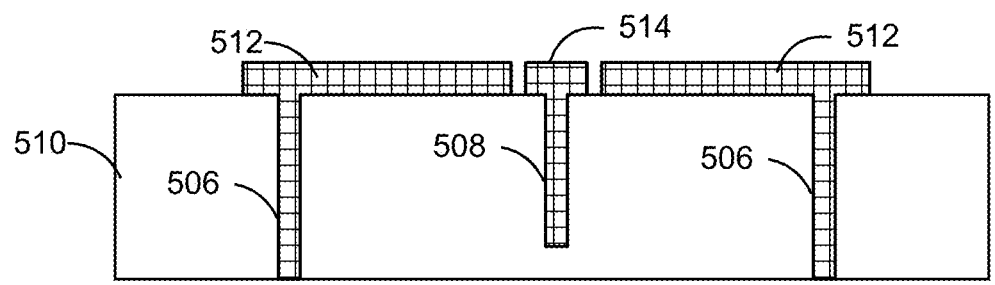

In FIGS. 5B and 5C, via structures 506 and 508 are formed in a second ceramic layer 510 and filled with metal during a metallization process. The via structure 506 is formed in the shape of the vertical conductive walls 212 defining the periphery of the ceramic cavity 206, while the via structure 508 is formed in the shape of the conductive rod 214. The metal filling the via structure 506 ultimately forms the vertical conductive wall 212 at the periphery of the ceramic cavity 206. Similarly, the metal filling the via structure 508 ultimately forms the conductive rod 214. The metal deposited during filling of the via structures 506 and 508 also extends to cover a portion of the upper surface of the second ceramic layer 510. In this example, a patterned metal layer 512 is deposited on the upper surface of the second ceramic layer 510. The patterned metal layer 512 ultimately forms the upper conductive wall 208 at the upper periphery of the ceramic cavity 206. Additionally, a further patterned metal layer 514 overlying the metal deposited in via structure 508 may be deposited on the upper surface of the second ceramic layer 510.

Figure 5D:
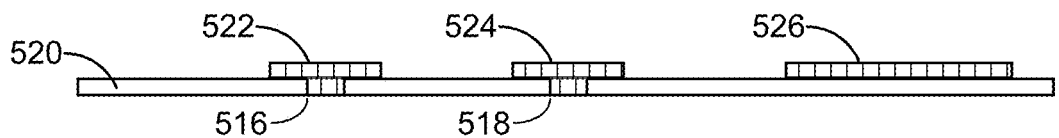

In FIG. 5D, via structures 516 and 518 are formed in a third ceramic layer 520. The via structures 516 and 518 are each filled with a metal layer that also extends above the via structures about a portion of the upper surface of the third ceramic layer 520 surrounding each of the via structures 516 and 518. The metal layer deposited in and about the via structures 516 and 518 form respective terminals 522 and 524, where terminal 522 ultimately provides the electrical connection with the conductive outer periphery of the ceramic cavity and terminal 524 provides an electrical connection with the conductive rod. Additionally, a patterned metal in the form of conductive strips 526 (only one conductive strip is shown in FIG. 5) may be deposited on the upper surface of the third ceramic layer 520. The conductive strips 526 form the conductive paths to the power supply.

Figure 5E:
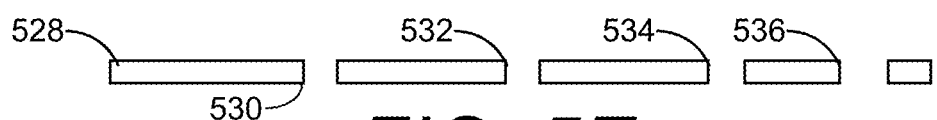

FIG. 5E shows a fourth ceramic layer 528 that ultimately forms the upper surface of the integrated ceramic resonator 200. In this example, a via structure 530 is formed through the fourth ceramic layer 528 and provides an opening for establishing an electrical connection between the conductive peripheral walls at the periphery of the ceramic cavity 206 and the active oscillator circuit housed in the surface-mounted integrated circuit package. A further via structure 532 is formed through the fourth ceramic layer 528 and provides an opening for establishing an electrical connection between the conductive rod 214 and the active oscillator circuit housed in the surface-mounted integrated circuit package. Further sets of via structures 534 and 536 may also be formed through the fourth ceramic layer 528. Via structures 534 may provide openings for establishing electrical connections between the power inputs of the surface-mounted integrated circuit package and the power strips 224, while via structures 536 provided openings for establishing electrical connections between the power supply and the power strips 224.

Figure 5F:
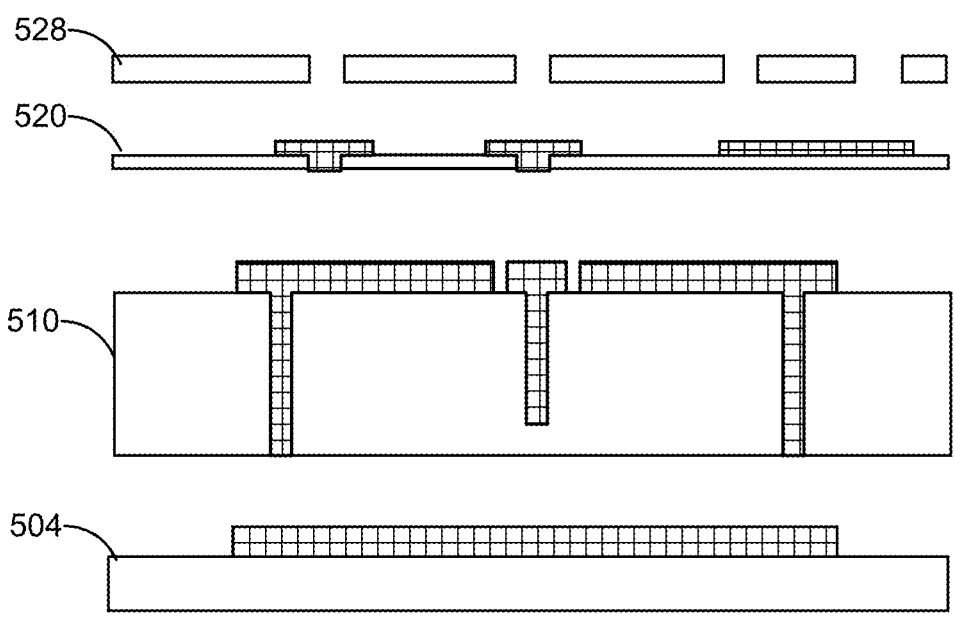

FIG. 5F shows the alignment of the ceramic layers and corresponding metallization layers prior to the final formation of the integrated ceramic resonator 200. As shown, the lower surface of ceramic layer 528 is aligned with the upper surface of ceramic layer 520. The bottom surface of ceramic layer 520 is aligned with the upper surface of ceramic layer 510. The bottom surface of ceramic layer 510 is aligned with the upper surface of the ceramic layer 504. Once aligned, the ceramic layers and their corresponding metallization layers are fused in a sintering process.

Figure 5G:
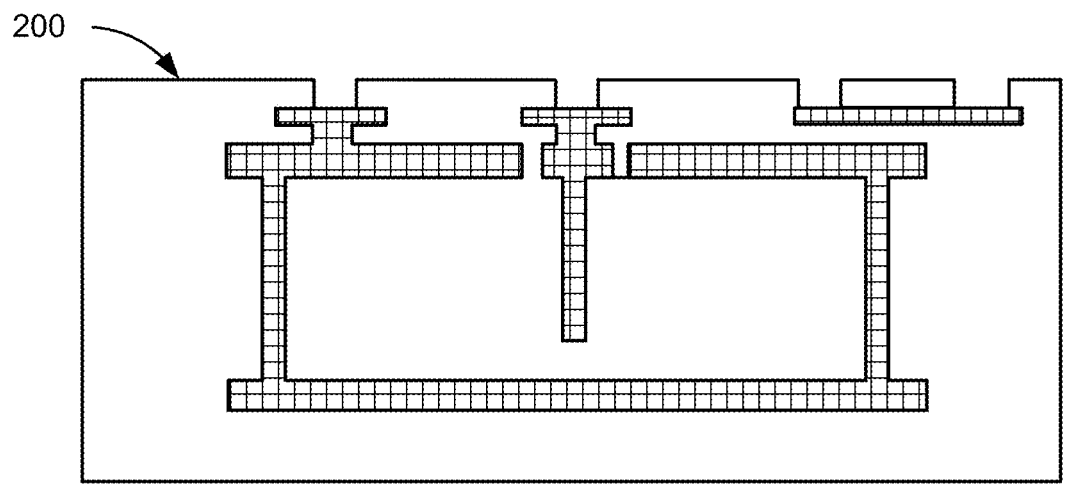
Figure 5H:
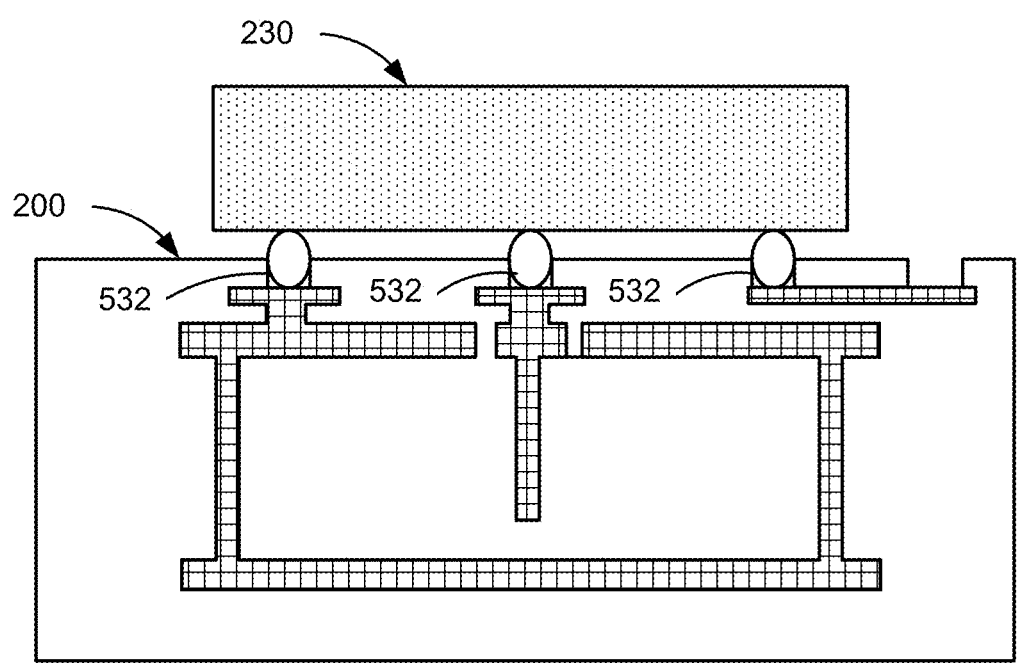

FIG. 5G shows the integrated ceramic resonator 200 with all of the ceramic layers and corresponding metallization layers fused to form a single integrated structure. FIG. 5H shows the surface-mounted integrated circuit package 230 mounted at the upper surface of the integrated ceramic resonator 200 using solder bumps extending through via structures 532 to complete the electrical connections between the surface-mounted integrated circuit package 230, the integrated ceramic resonator 200, and the power supply.

Figure 6:
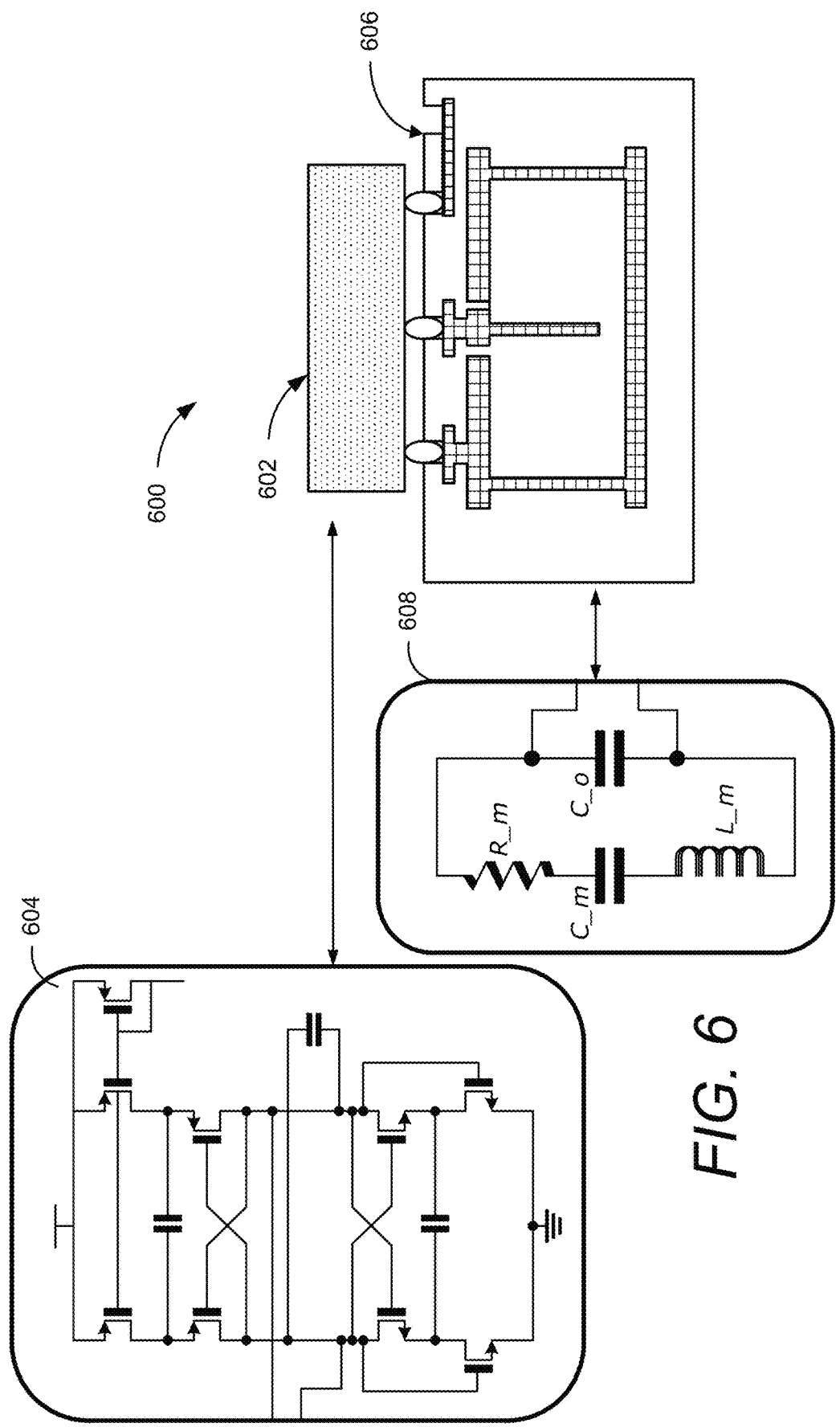
FIG. 6 shows schematic representations of circuit model equivalents that correspond to the components of an RF oscillator constructed in accordance with aspects of the disclosure.

FIG. 6 shows schematic representations of circuit model equivalents that correspond to the components of an RF oscillator 600 constructed in accordance with aspects of the disclosure. In an aspect, the surface-mounted integrated circuit package 602 housing the active oscillator circuit may be represented by the equivalent active circuit model shown at 604. In an aspect, the integrated ceramic resonator 606 may be represented by the equivalent passive circuit model shown at 608.

Figure 7:
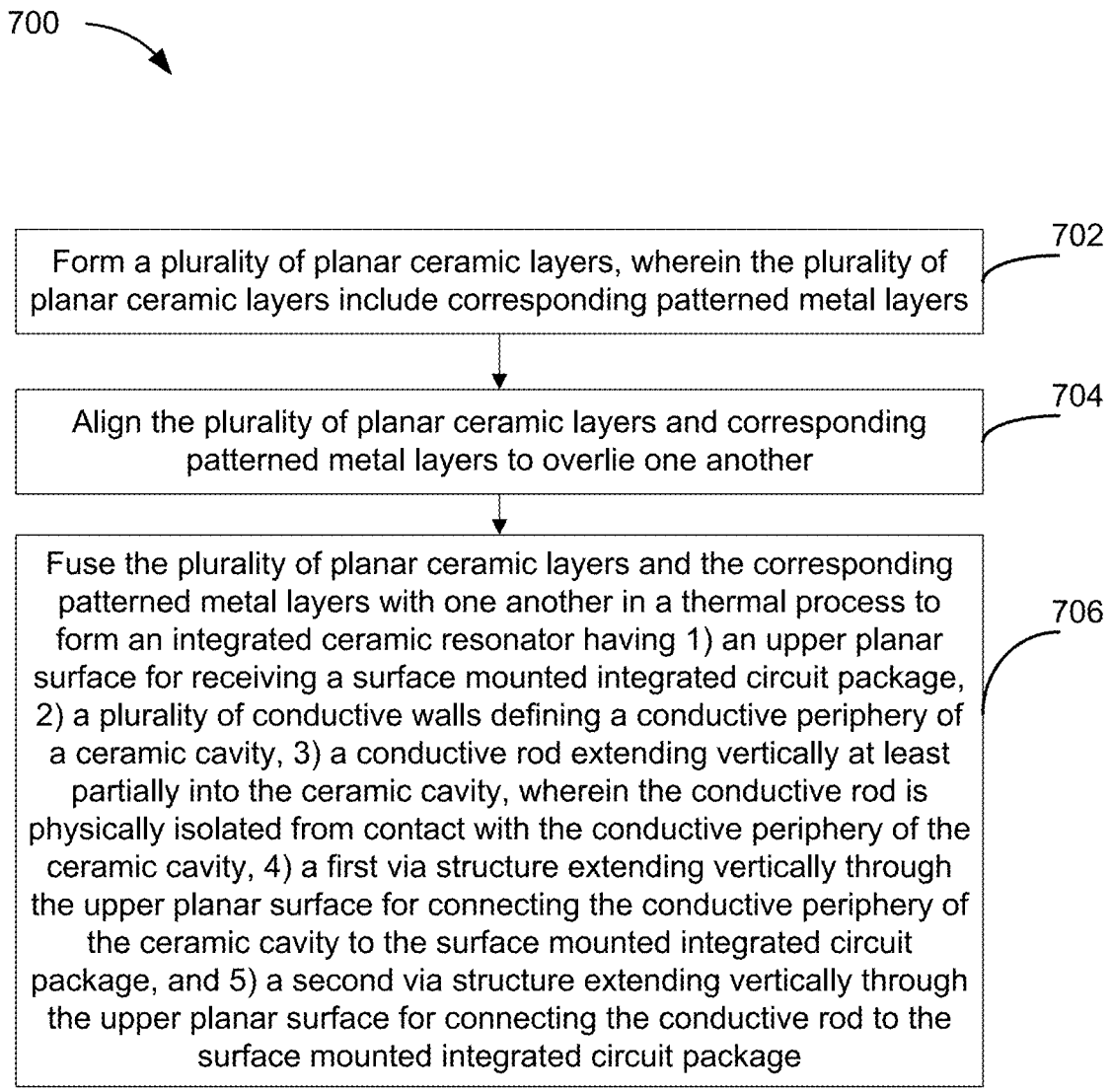
FIG. 7 shows an example method for manufacturing an integrated device, according to aspects of the disclosure.

FIG. 7 shows an example method 700 for manufacturing an integrated device, according to aspects of the disclosure. At operation 702, a plurality of planar ceramic layers are formed, wherein one or more of the plurality of planar ceramic layers include corresponding patterned metal layers. At operation 704, the plurality of planar ceramic layers and corresponding patterned metal layers are aligned to overlie one another. At operation 706, the plurality of planar ceramic layers and the corresponding patterned metal layers are fused with one another in a thermal process to form an integrated ceramic resonator having an upper planar surface for receiving a surface-mounted integrated circuit package, a plurality of conductive walls defining a conductive periphery of a ceramic cavity, a conductive rod extending vertically at least partially into the ceramic cavity, wherein the conductive rod is isolated from contact with the conductive periphery of the ceramic cavity, a first via structure extending vertically through the upper planar surface for connecting the conductive periphery of the ceramic cavity to the surface mounted integrated circuit package, and a second via structure extending vertically through the upper planar surface for connecting the conductive rod to the surface mounted integrated circuit package.

It should be noted that the method 700 of FIG. 7 may combine one or more processes in order to simplify and/or clarify the method for providing or fabricating a package that includes an integrated ceramic resonator. In some implementations, the order of the processes may be changed or modified.

Technical advantages of the method 700 include the manufacturing of an integrated ceramic resonator to which a surface mounted integrated circuit package may be mounted to avoid resonant frequency tuning and stability issues that otherwise occur when a passive resonator is wire bonded with an active oscillator circuit. The manufacturing steps are easily implemented and the resulting integrated ceramic resonator may be configured to operate at high radio frequencies with high Q factors.

Figure 8:
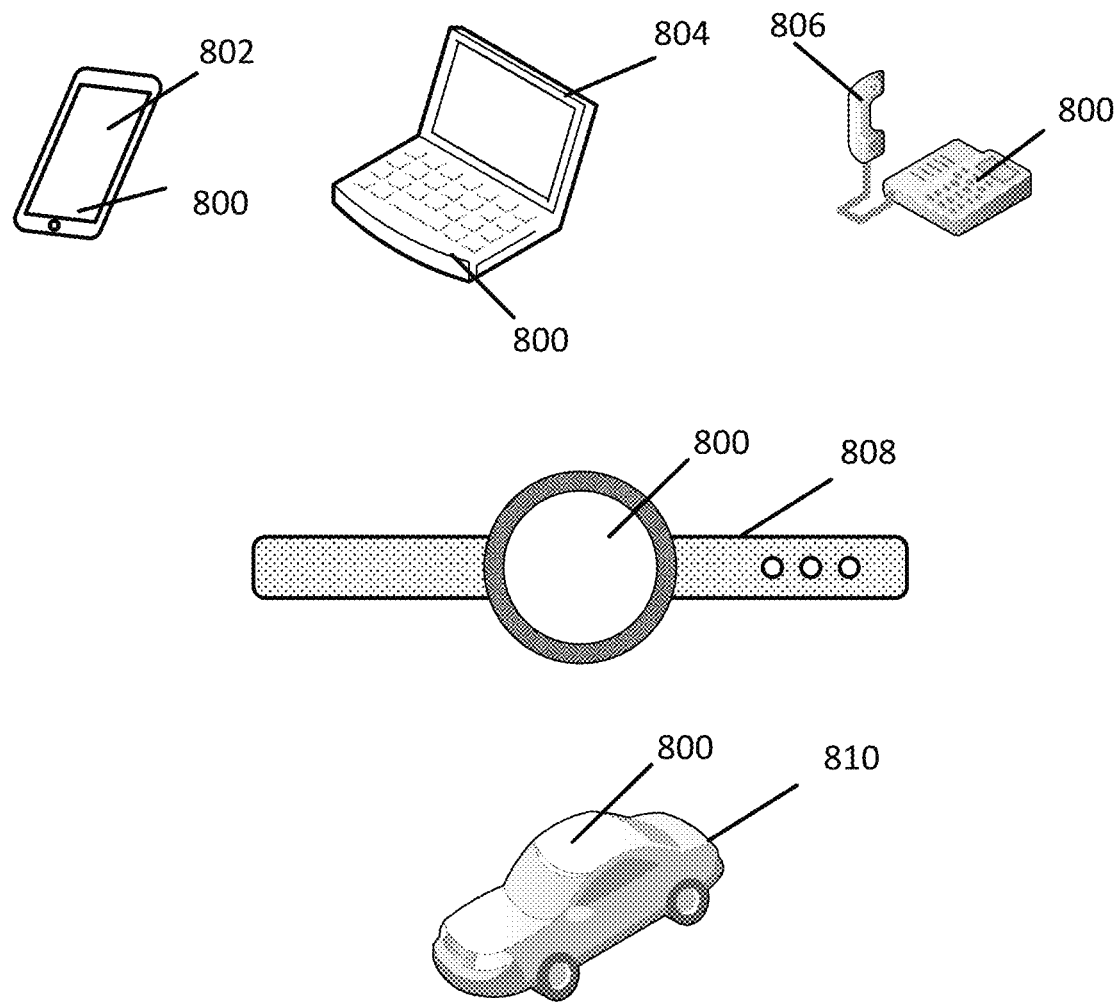
FIG. 8 illustrates various electronic devices that may be integrated with any of the devices described herein, according to aspects of the disclosure.

FIG. 8 illustrates various electronic devices that may be integrated with any of the aforementioned devices, integrated devices, integrated circuit (IC) packages, integrated circuit (IC) devices, semiconductor devices, integrated circuits, dies, interposer packages, package-on-package (POP), System in Package (SiP), or System on Chip (SoC). For example, a mobile phone device 802, a laptop computer device 804, a fixed location terminal device 806, a wearable device 808, or automotive vehicle 810 may include a device 800 as described herein. The device 800 may be, for example, any of the devices and/or integrated circuit (IC) packages described herein. The devices 802, 804, 806 and 808 and the vehicle 810 illustrated in FIG. 8 are merely exemplary. Other electronic devices may also feature the disclosed RF oscillator, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

Implementation examples are described in the following numbered aspects:

The foregoing disclosed devices and functionalities may be designed and stored in computer files (e.g., register-transfer level (RTL), Geometric Data Stream (GDS) Gerber, and the like) stored on computer-readable media. Some or all such files may be provided to fabrication handlers who fabricate devices based on such files. Resulting products may include various components, including semiconductor wafers that are then cut into semiconductor die and packaged into semiconductor packages, integrated devices, package on package devices, system-on-chip devices and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

It is noted that the figures in the disclosure may represent actual representations and/or conceptual representations of various parts, components, objects, devices, packages, integrated devices, integrated circuits, and/or transistors. In some instances, the figures may not be to scale. In some instances, for the purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the detailed description above, it can be seen that different features are grouped together in examples. This manner of disclosure should not be understood as an intention that the example aspects have more features than are explicitly mentioned in each aspect. Rather, the various aspects of the disclosure may include fewer than all features of an individual example aspect disclosed. Therefore, the following aspects should hereby be deemed to be incorporated in the description, wherein each aspect by itself can stand as a separate example. Although each dependent aspect can refer in the aspects to a specific combination with one of the other aspects, the aspect(s) of that dependent aspect are not limited to the specific combination. It will be appreciated that other example aspects can also include a combination of the dependent aspect(s) with the subject matter of any other dependent aspect or independent aspect or a combination of any feature with other dependent and independent aspects. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of an aspect can be included in any other independent aspect, even if the aspect is not directly dependent on the independent aspect.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A device, comprising:
   a surface-mounted integrated circuit package housing an active oscillator circuit; and
   an integrated ceramic resonator formed from a ceramic substrate having an upper planar surface receiving the surface-mounted integrated circuit package, the integrated ceramic resonator including
   a plurality of conductive walls forming a conductive periphery of a ceramic cavity in the ceramic substrate,
   a conductive rod extending vertically at least partially into the ceramic cavity, wherein the conductive rod is isolated from contact with the conductive periphery of the ceramic cavity,
   a first conductive material extending vertically through the upper planar surface of the ceramic substrate for connecting the conductive periphery of the ceramic cavity to the surface-mounted integrated circuit package housing the active oscillator circuit, and
   a second conductive material extending through the upper planar surface of the ceramic substrate for connecting the conductive rod to the surface-mounted integrated circuit package housing the active oscillator circuit.

2. The device of claim 1, wherein:
   the conductive rod extends into the ceramic cavity along a central vertical axis of the ceramic cavity.

3. The device of claim 1, wherein the plurality of conductive walls forming the conductive periphery of the ceramic cavity comprise:
   an upper conductive wall;
   a lower conductive wall vertically spaced from the upper conductive wall; and
   a vertical conductive wall connecting the upper conductive wall with the lower conductive wall.

4. The device of claim 1, wherein:
   the conductive rod has a diameter and terminates at a distance from a bottom conductive wall of the ceramic cavity, and
   the diameter and the distance determine, at least in part, a resonant frequency of the integrated ceramic resonator.

5. The device of claim 1, wherein:
   the integrated ceramic resonator has a resonant frequency proximate or above 1 gigahertz (GHz).

6. The device of claim 1, wherein:
   the plurality of conductive walls and the conductive rod are arranged and dimensioned to have a resonant frequency proximate 2.5 gigahertz (GHz).

7. The device of claim 1, wherein:
   the plurality of conductive walls and the conductive rod are arranged and dimensioned to have a resonant frequency greater than 2.5 gigahertz (GHz).

8. The device of claim 1, wherein the device comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

9. An integrated ceramic resonator, comprising:
   a ceramic substrate having an upper planar surface for receiving a surface-mounted integrated circuit package;
   a plurality of conductive walls forming a conductive periphery of a ceramic cavity in the ceramic substrate;
   a conductive rod extending vertically at least partially into the ceramic cavity, wherein the conductive rod is isolated from contact with the conductive periphery of the ceramic cavity;
   a first via structure disposed vertically through the upper planar surface of the ceramic substrate for connecting the conductive periphery of the ceramic cavity to the surface-mounted integrated circuit package; and
   a second via structure disposed through the upper planar surface of the ceramic substrate for connecting the conductive rod to the surface-mounted integrated circuit package.

10. The integrated ceramic resonator of claim 9, wherein:
    the conductive rod extends along a central vertical axis of the ceramic cavity.

11. The integrated ceramic resonator of claim 9, wherein the plurality of conductive walls forming the conductive periphery of the ceramic cavity comprise:
    an upper conductive wall;
    a lower conductive wall vertically spaced from the upper conductive wall; and a vertical conductive wall connecting the upper conductive wall with the lower conductive wall.

12. The integrated ceramic resonator of claim 11, wherein:
the upper conductive wall and the lower conductive wall are planar structures that are parallel with one another.

13. The integrated ceramic resonator of claim 11, wherein:
the vertical conductive wall is formed as a cylindrical structure.

14. The integrated ceramic resonator of claim 11, wherein:
the vertical conductive wall is formed as an octagonal or higher degree sided structure.

15. The integrated ceramic resonator of claim 9, wherein:
the conductive rod has a diameter and terminates at a distance from a bottom conductive wall of the ceramic cavity, and
the diameter and the distance determine a resonant frequency of the integrated ceramic resonator.

16. The integrated ceramic resonator of claim 11, further comprising:
a first conductive metal structure formed in the first via structure and providing a first conductive path directly between the conductive periphery of the ceramic cavity and the surface-mounted integrated circuit package; and
a second conductive metal structure formed in the second via structure and providing a second conductive path directly between the conductive rod and the surface-mounted integrated circuit package.

17. The integrated ceramic resonator of claim 11, wherein:
the plurality of conductive walls and the conductive rod are arranged and dimensioned to have a resonant frequency above 1 gigahertz (GHz).

18. The integrated ceramic resonator of claim 11, wherein:
the plurality of conductive walls and the conductive rod are arranged and dimensioned to have a resonant frequency proximate 2.5 gigahertz (GHz).

19. The integrated ceramic resonator of claim 11, wherein:
the plurality of conductive walls and the conductive rod are arranged and dimensioned to have a resonant frequency greater than 2.5 gigahertz (GHz).

20. A method for manufacturing an integrated device, comprising:
forming a plurality of planar ceramic layers wherein one or more of the plurality of planar ceramic layers include corresponding patterned metal layers;
aligning the plurality of planar ceramic layers and corresponding patterned metal layers to overlie one another; and
fusing the plurality of planar ceramic layers and the corresponding patterned metal layers with one another in a thermal process to form an integrated ceramic resonator having
an upper planar surface for receiving a surface-mounted integrated circuit package,
a plurality of conductive walls defining a conductive periphery of a ceramic cavity,
a conductive rod extending vertically at least partially into the ceramic cavity, wherein the conductive rod is isolated from contact with the conductive periphery of the ceramic cavity,
a first via structure extending vertically through the upper planar surface for connecting the conductive periphery of the ceramic cavity to the surface-mounted integrated circuit package, and
a second via structure extending vertically through the upper planar surface for connecting the conductive rod to the surface-mounted integrated circuit package.

21. The method of claim 20, wherein forming the plurality of planar ceramic layers and the corresponding patterned metal layers comprises:
forming a first planar ceramic layer;
forming a rod-shaped hole partially through the first planar ceramic layer;
forming third via structure through the first planar ceramic layer about the rod-shaped hole; and
depositing a first metal layer on an upper surface of the first planar ceramic layer, in the rod-shaped hole, and in the third via structure, wherein, after the plurality of planar ceramic layers and the corresponding patterned metal layers have been fused with one another, the first metal layer forms
an upper conductive wall of the ceramic cavity,
conductive sidewalls of the ceramic cavity, and
the conductive rod.

22. The method of claim 21, wherein forming the plurality of planar ceramic layers and the corresponding patterned metal layers comprises:
forming a second planar ceramic layer; and
depositing a second metal layer on an upper surface of the second planar ceramic layer, wherein the second metal layer forms a lower conductive wall of the ceramic cavity after the plurality of planar ceramic layers and the corresponding patterned metal layers have been fused with one another.

23. The method of claim 21, wherein forming the plurality of planar ceramic layers in the corresponding patterned metal layers comprises:
forming a third planar ceramic layer;
forming fourth via structure through the third planar ceramic layer;
forming a fifth via structure through the third planar ceramic layer; and
depositing a third metal layer in the third via structure, the fourth via structure, over a first portion of an upper surface of the third planar ceramic layer overlying the fourth via structure, and over a second portion of the upper surface of the third planar ceramic layer overlying the fifth via structure, wherein, after the plurality of planar ceramic layers and the corresponding patterned metal layers have been fused with one another, the third metal layer forms
a first conductive path between the conductive periphery of the ceramic cavity and the first via structure, and
a second conductive path between the conductive rod and the second via structure.

24. The method of claim 23, wherein forming the plurality of planar ceramic layers and the corresponding patterned metal layers comprises:
forming a fourth planar ceramic layer;
forming a sixth via structure through the fourth planar ceramic layer; and
forming a seventh via structure through the fourth planar ceramic layer, wherein, after the plurality of planar ceramic layers and the corresponding patterned metal layers have been fused with one another,
- the sixth via structure forms the first via structure of the integrated ceramic resonator,
- the seventh via structure forms the second via structure of the integrated ceramic resonator, and
- an upper surface of the fourth planar ceramic layer forms the upper planar surface for receiving the surface-mounted integrated circuit package.

25. The method of claim 20, further comprising:
mounting the surface-mounted integrated circuit package on the upper planar surface of the integrated ceramic resonator, wherein mounting the surface-mounted integrated circuit package includes
- forming a first conductive path through the first via structure to a first input of an oscillator circuit housed within the surface-mounted integrated circuit package, and
- forming a second conductive path through the second via structure to a second input of the oscillator circuit housed in the surface-mounted integrated circuit package.

26. The method of claim 20, wherein:
the corresponding patterned metal layers, after fusing the plurality of planar ceramic layers and the corresponding patterned metal layers with one another, form the conductive periphery of the ceramic cavity to include
- an upper conductive wall,
- a lower conductive wall vertically spaced from the upper conductive wall, and
- a vertical conductive wall connecting the upper conductive wall with the lower conductive wall.

27. The method of claim 26, wherein:
the corresponding patterned metal layers, after fusing the plurality of planar ceramic layers and the corresponding patterned metal layers with one another, form the upper conductive wall and the lower conductive wall as planar structures that are parallel with one another.

28. The method of claim 26, wherein:
the corresponding patterned metal layers, after fusing the plurality of planar ceramic layers and the corresponding patterned metal layers with one another, form the vertical conductive wall as a cylindrical structure.

29. The method of claim 26, wherein:
the corresponding patterned metal layers, after fusing the plurality of planar ceramic layers and the corresponding patterned metal layers with one another, form the vertical conductive wall as an octagon or higher degree multi-sided structure.

30. The method of claim 26, wherein:
the corresponding patterned metal layers, after fusion, form the conductive rod as a fixed diameter conductive rod that extends into the ceramic cavity and terminates a fixed distance from a lower conductive wall of the ceramic cavity, and
the fixed diameter conductive rod and the fixed distance are selected to determine a resonant frequency of the integrated ceramic resonator.

* * * * *